US012622056B2

(12) United States Patent
Li et al.

(10) Patent No.: US 12,622,056 B2
(45) Date of Patent: May 5, 2026

(54) ARRAY SUBSTRATE, DISPLAY PANEL AND DISPLAY DEVICE

(71) Applicant: BEIJING SHIYAN TECHNOLOGY CO., LTD., Beijing (CN)

(72) Inventors: Changfeng Li, Beijing (CN); Fuqiang Li, Beijing (CN); Zhongyuan Wu, Beijing (CN); Lizhen Zhang, Beijing (CN); Hongrun Wang, Beijing (CN); Jing Yu, Beijing (CN)

(73) Assignee: BEIJING SHIYAN TECHNOLOGY CO., LTD., Beijing (CN)

( * ) Notice: Subject to any disclaimer, the term of this patent is extended or adjusted under 35 U.S.C. 154(b) by 30 days.

(21) Appl. No.: 18/720,858

(22) PCT Filed: Aug. 25, 2023

(86) PCT No.: PCT/CN2023/115080
§ 371 (c)(1),
(2) Date: Jun. 17, 2024

(87) PCT Pub. No.: WO2024/139308
PCT Pub. Date: Jul. 4, 2024

(65) Prior Publication Data
US 2025/0351574 A1 Nov. 13, 2025

(30) Foreign Application Priority Data
Dec. 26, 2022 (CN) ........................ 202211679554.X

(51) Int. Cl.
*H10D 86/40* (2025.01)
*G02F 1/1343* (2006.01)
(Continued)

(52) U.S. Cl.
CPC ....... *H10D 86/441* (2025.01); *G02F 1/13439* (2013.01); *G02F 1/136286* (2013.01); *G02F 1/1368* (2013.01)

(58) Field of Classification Search
CPC .............. H10D 86/441; G02F 1/13439; G02F 1/136286
See application file for complete search history.

(56) References Cited

U.S. PATENT DOCUMENTS 6,456,013 B1 9/2002 Komiya et al.
2017/0103690 A1* 4/2017 Yang ......................... G09F 9/30
2021/0173209 A1* 6/2021 Itonaga ................ H04N 13/344

FOREIGN PATENT DOCUMENTS

CN 204009303 U 12/2014
CN 107920432 A 4/2018
(Continued)

OTHER PUBLICATIONS

Extended European Search Report and Search Opinion received for European Application No. 23909248.9, mailed on Jun. 30, 2025, 9 pages.

*Primary Examiner* — Lucy P Chien
(74) *Attorney, Agent, or Firm* — ArentFox Schiff LLP; Michael Fainberg

(57) ABSTRACT

Disclosed are an array substrate, a display panel, and a display device for mitigating microscopic moiré. The array substrate includes: first signal lines, and second signal lines. Each second signal line includes: first portions extending along the column direction, and second portions; the second portion includes parts extending along the included direction, and the second portion connects two first portions; an included angle between the included direction and the column direction, and an included angle between the included direction and the row direction are greater than 0; and the first portion is adjacent to an opening region of a (Continued)

sub-pixel unit in the row direction, the plurality of second portions each pass through a region between two adjacent pixel repeating unit rows of at least partial pixel repeating unit rows, and a distance between two first portions connected with the second portion in the row direction is greater than 0.

18 Claims, 14 Drawing Sheets

(51) Int. Cl.
 G02F 1/1362 (2006.01)
 G02F 1/1368 (2006.01)

(56) References Cited

FOREIGN PATENT DOCUMENTS

| | | | |
|---|---|---|---|
| CN | 211348942 | U | 8/2020 |
| CN | 113325638 | A | 8/2021 |
| CN | 113608386 | A | 11/2021 |
| CN | 115268154 | A | 11/2022 |
| JP | 2001-100657 | A | 4/2001 |
| WO | 2021/196089 | A1 | 10/2021 |
| WO | 2022/205164 | A1 | 10/2022 |

* cited by examiner

| Dark | Slightly bright | Brighter | Brighter | Slightly bright |
|------|-----------------|----------|----------|-----------------|
| Dark | Slightly bright | Brighter | Brighter | Slightly bright |
| Dark | Slightly bright | Brighter | Brighter | Slightly bright |
| Dark | Slightly bright | Brighter | Brighter | Slightly bright |

ARRAY SUBSTRATE, DISPLAY PANEL AND DISPLAY DEVICE

CROSS REFERENCE TO RELATED APPLICATIONS

The present disclosure is a National Stage of International Application No. PCT/CN2023/115080, filed Aug. 25, 2023, which claims priority to the Chinese patent application No. 202211679554. X, filed on Dec. 26, 2022 to the China National Intellectual Property Administration, and entitled "Array Substrate, Display Panel and Display Device", the entire content of which is incorporated herein by reference.

TECHNICAL FIELD

The present disclosure relates to the technical field of display, in particular to an array substrate, a display panel and a display device.

BACKGROUND

With the continuous development of the display technology, the three-dimensional (3D) display technology is getting more and more attention. Three-dimensional display technology can make the display screen become stereoscopic and realistic. The principle is that: by using the left and right eyes of a person to respectively receive a left eye image and a right eye image with a certain parallax, after the two parallax images are received by the left and right eyes of a person respectively, the brain superimposes and fuses the image information, and a 3D visual display effect is built. In order to realize the compatibility of the ultra-multiple viewpoint 3D display and the light field display, a conventional sub-pixel is made into a pixel island structure, and each pixel island includes a plurality of sub-pixels, so that when the display information of the plurality of sub-pixels is different and a single eye enters into a plurality of viewpoints, the ordinary light field display can be realized, and when the display information of the plurality of sub-pixels is different and a single eye enters into a single viewpoint, the ultra-multiple viewpoint light field 3D display can be realized.

However, the 3D display products in the prior art have the problem of moiré.

SUMMARY

Embodiments of the present disclosure provide an array substrate, a display panel and a display device, for mitigating microscopic moiré.

Embodiments of the present disclosure provide an array substrate, including: a base substrate; and a plurality of sub-pixel units, a plurality of first signal lines and a plurality of second signal lines on a side of the base substrate. The plurality of first signal lines and the plurality of second signal lines intersect with each other to define opening regions of the plurality of sub-pixel units; the plurality of sub-pixel units are arranged in an array along a row direction and a column direction, the plurality of sub-pixel units spaced apart along the row direction form a pixel island, a plurality of pixel islands arranged consecutively along the column direction form a pixel repeating unit; and one row of pixel repeating units arranged along the row direction form a pixel repeating unit row, and opening regions of one row of sub-pixel units arranged along the row direction form an opening region row; the plurality of first signal lines are arranged along the column direction, and the plurality of second signal lines are arranged along the row direction; each of the plurality of second signal lines includes: a plurality of first portions extending along the column direction, and a plurality of second portions; the second portion includes parts extending along an inclined direction, and the second portion connects two of the plurality of first portions; and an included angle between the inclined direction and the column direction and an included angle between the inclined direction and the row direction are greater than 0; and the first portion is adjacent to the opening region of the sub-pixel in the row direction, the plurality of second portions each pass through a region between two adjacent pixel repeating unit rows of at least partial pixel repeating unit rows, and a distance between two first portions connected with the second portion in the row direction is greater than 0.

In some embodiments, the plurality of first signal lines include: a plurality of first scanning lines and a plurality of second scanning lines; and the plurality of first scanning lines and the plurality of second scanning lines are sequentially alternated; sub-pixel units in a same row are electrically connected with one of the plurality of first scanning lines and one of the plurality of second scanning lines, and the first scanning line and the second scanning line correspondingly electrically connected with the sub-pixel units in the same row of are on two sides of the opening region row in the column direction; the plurality of second signal lines include: a plurality of data lines and a plurality of common electrode lines; and the plurality of data lines and the plurality of common electrode lines are alternately arranged; each of the plurality of data lines is electrically connected with two columns of sub-pixel units adjacent to the data line in the row direction; the sub-pixel unit includes a thin film transistor; and a gate electrode of the thin film transistor is electrically connected with the first signal line and a source electrode of the thin film transistor is electrically connected with the data line; and in two adjacent rows of sub-pixel units, two thin film transistors electrically connected with a same data line share a source electrode.

In some embodiments, active layers of two thin film transistors electrically connected with the second portion in the data line are integrally connected; and the second portion in the data line is electrically connected with the active layers integrally connected only through one first via hole.

In some embodiments, the second portion includes: two first subparts extending along the inclined direction and parallel to each other, and a second subpart connecting the two first subparts; and the second subpart extends along the column direction, and the two first subparts are connected with different first portions, respectively.

In some embodiments, an orthographic projection of one of the two first subparts on the base substrate overlaps with an orthographic projection of the first scanning line on the base substrate, and an orthographic projection of the other of the two first subparts on the base substrate overlaps with an orthographic projection of the second scanning line on the base substrate; and an orthographic projection of the second subpart on the base substrate and an orthographic projection of the first signal line on the base substrate do not overlap with each other.

In some embodiments, each of the plurality of second signal lines further includes: a plurality of third portions; and first portions other than the first portions connected through the second portions are connected through the plurality of third portions. Two first portions connected through the third portion are on a same straight line in the column direction; the third portion includes: a third subpart extending along a first inclined direction, a fourth subpart extending along a second inclined direction, and a fifth subpart extending along the column direction; two ends of the fifth subpart are electrically connected with the third subpart and the fourth subpart, respectively; and the third subpart and the fourth subpart are electrically connected with two different first portions, respectively; the first inclined direction intersects with the second inclined direction; and two first portions connected through the third portion are on a same straight line in the column direction.

In some embodiments, an orthographic projection of the third subpart on the base substrate overlaps with an orthographic projection of the second scanning line on the base substrate, and an orthographic projection of the fourth subpart on the base substrate overlaps with an orthographic projection of the first scanning line on the base substrate; and an orthographic projection of the fifth subpart on the base substrate and an orthographic projection of the first signal line on the base substrate do not overlap with each other.

In some embodiments, active layers of two thin film transistors electrically connected with the third portion are integrally connected, and the third portion is electrically connected with the active layers electrically connected integrally only through one first via hole.

In some embodiments, the opening regions of the sub-pixels in any two adjacent pixel repeating unit rows are misaligned in the row direction; an orthographic projection of the second portion on the base substrate overlaps with an orthographic projection of a region between two adjacent opening region rows which are respectively located in two different pixel repeating unit rows on the base substrate; and an orthographic projection of the third portion on the base substrate overlaps with an orthographic projection of a region between two adjacent opening region rows in the same pixel repeating unit row on the base substrate.

In some embodiments, in the row direction, a ratio of a width of the opening region of the sub-pixel unit to a width of the pixel island is i/M, where M is an integer greater than 1, and i is an integer greater than or equal to 1 and less than M; the plurality of pixel repeating unit rows are divided into a plurality of pixel repeating unit groups, and each of the plurality of pixel repeating unit groups includes M pixel repeating unit rows; and in each of the plurality of pixel repeating unit groups, a ratio of a misalignment vector of a first portion corresponding to a $j^{th}$ pixel repeating unit row with respect to a first portion corresponding to a $1^{st}$ pixel repeating unit row in the row direction to the width of the opening region of the sub-pixel unit in the row direction is $Jj=\pm E/M$, where j is an integer greater than 1 and less than or equal to M, and E is an integer greater than or equal to 1 and less than M.

In some embodiments, the sub-pixel unit further includes a pixel electrode electrically connected with the thin film transistor. An orthographic projection of the pixel electrode on the base substrate is non-rectangular; and an edge of the pixel electrode adjacent to the second signal line has a shape of a folded line. The pixel electrode is divided into a sixth portion adjacent to the first portion, and a seventh portion connected with the sixth portion and adjacent to the second portion or the third portion; and the edge of the seventh portion adjacent to the second signal line extends along the column direction, and an included angle between at least part of the edge of the sixth portion adjacent to the second signal line and the column direction is greater than 0.

In some embodiments, the array substrate further includes a common electrode electrically connected with the common electrode line; the common electrode is on a side of the pixel electrode facing away from the base substrate; the common electrode includes: a first pattern layer, and a second pattern layer on a side of the first pattern layer facing away from the base substrate; and the first pattern layer is electrically connected with the second pattern layer. The first pattern layer includes a plurality of first striped portions arranged along the row direction and extending along the column direction, and first opening regions between the plurality of first striped portions; the second pattern layer includes a plurality of second striped portions arranged along the row direction and extending along the column direction; and a distance between the first striped portion and the second striped portion is greater than 0 in the row direction; and an orthographic projection of the first striped portion on the base substrate covers an orthographic projection of the second signal line on the base substrate, the orthographic projection of the first striped portion on the base substrate and an orthographic projection of the pixel electrode on the base substrate do not overlap with each other, and an orthographic projection of the second striped portion on the base substrate overlaps with an orthographic projection of the pixel electrode on the base substrate.

In some embodiments, in the row direction, a distance between the pixel electrode and the first striped portion is greater than 0.

In some embodiments, the first striped portion includes a first sub-layer and a second sub-layer that are stacked in a direction perpendicular to the base substrate; the second sub-layer is on a side of the first sub-layer facing away from the base substrate; in the row direction, a width of the first sub-layer is greater than a width of the second sub-layer; and an orthographic projection of the second sub-layer on the base substrate is within an orthographic projection of the first sub-layer on the base substrate.

In some embodiments, a thickness of the second sub-layer is greater than or equal to 0.1 micrometers and less than or equal to 2 micrometers in the direction perpendicular to the base substrate.

In some embodiments, the first pattern layer further includes a third striped portion extending along the row direction and connected with the plurality of first striped portions, and the second pattern layer further includes a fourth striped portion extending along the row direction and connected with the plurality of second striped portions; and an orthographic projection of the fourth striped portion on the base substrate overlaps with an orthographic projection of the third striped portion on the base substrate, and the second pattern layer covers an edge of the third striped portion close to a side of the first opening region.

In some embodiments, in the column direction, orthographic projections of two third striped portions on both sides of the first opening region on the base substrate overlap with an orthographic projection of the pixel electrode on the base substrate.

In some embodiments, an orthographic projection of the common electrode on the base substrate and an orthographic projection of the gate electrode of the thin film transistor on the base substrate do not overlap with each other.

In some embodiments, the first pattern layer is a light-shielding conductive layer and the second pattern layer is a transparent conductive layer.

Embodiments of the present disclosure provide a display panel, including: the array substrate provided by embodiments of the present disclosure, an opposite substrate opposite to the array substrate; and a liquid crystal layer between the array substrate and the opposite substrate.

Embodiments of the present disclosure provide a display device, including: the display panel provided by embodiments of the present disclosure.

In some embodiments, the display device further includes: a light splitting assembly on a display side of the display panel. The light splitting assembly includes a plurality of light splitting repeating units extending along the column direction and continuously arranged along the row direction; the light splitting repeating unit includes M light splitting structures extending along the column direction and continuously arranged along the row direction; and each of the plurality of light splitting repeating units corresponds to N columns of sub-pixel units in the pixel repeating unit row. M and N are both integers greater than 1, and M and N are relatively prime.

BRIEF DESCRIPTION OF FIGURES

FIG. 2 is a schematic diagram of a relative luminance distribution of a display device in the related art.

DETAILED DESCRIPTION

Figure 1:
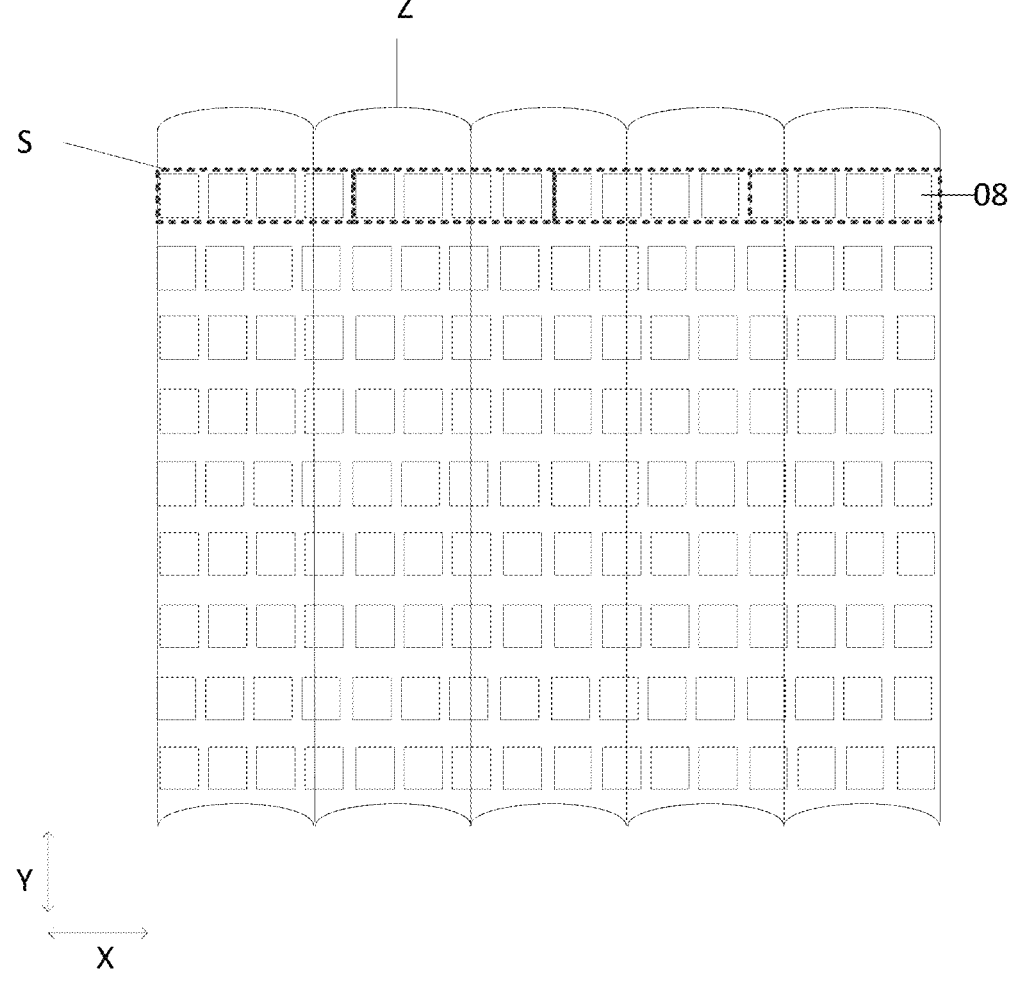
FIG. 1 is a schematic structural diagram of a display device in the related art.

In order to make the objects, technical solutions and advantages of embodiments of the present disclosure clearer, the technical solutions of embodiments of the present disclosure will be described clearly and completely in the following in conjunction with the accompanying drawings of embodiments of the present disclosure. Obviously, the described embodiments are some embodiments of the present disclosure, and not all of embodiments. And embodiments and features in the embodiments of the present disclosure can be combined with each other without conflict. Based on the described embodiments of the present disclosure, all other embodiments obtained by a person of ordinary skill in the art without creative labors are within the scope of protection of the present disclosure.

Unless otherwise defined, technical or scientific terms used in the present disclosure shall have the ordinary meaning understood by a person of ordinary skill in the art to which the present disclosure belongs. The words "first", "second", and the like used in the present disclosure do not indicate any order, quantity, or significance, but are only used to distinguish different components. The words "including" or "comprising" and the like mean that the component or object appearing before the word encompasses the components or objects listed after the word and their equivalents, without excluding other components or objects. Words such as "connected" or "coupled" are not limited to physical or mechanical connections, but may include electrical connections, whether direct or indirect.

It should be noted that the dimensions and shapes of the figures in the accompanying drawings do not reflect true proportions, but are intended to illustrate the present disclosure. And throughout the same or similar reference numeral denotes the same or similar elements or elements having the same or similar function.

Figure 3:
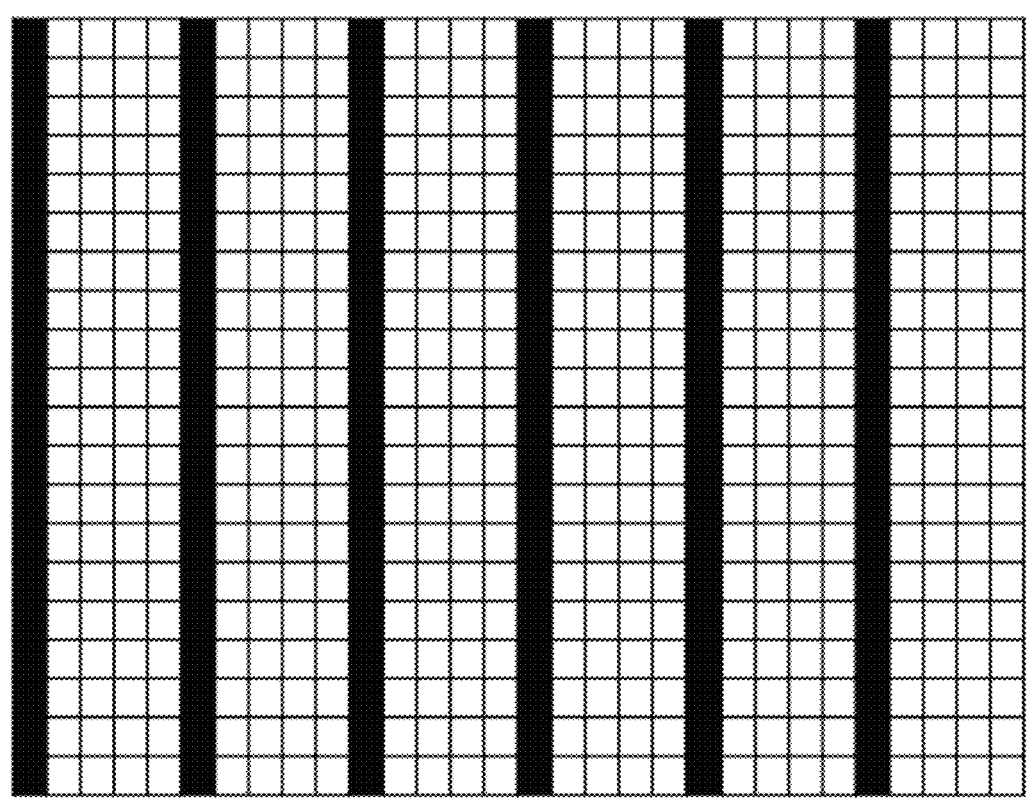
FIG. 3 is a schematic diagram of a visual sensory distribution of a display device in the related art.

In the related art, as shown in FIG. 1, the display device includes: a plurality of pixel islands S spaced apart along a row direction X and a column direction Y, and a plurality of cylinder lenses Z; each pixel island S has a plurality of sub-pixels 08 spaced apart along the row direction X; and M cylinder lenses Z correspondingly cover N columns of sub-pixels, which solves the problem of macroscopic moiré, but generates the problem of microscopic moiré. In a unit with a cycle of M=5, the region corresponding to each cylinder lens has different brightness at different viewing angles in space, and the brightness of the five cylinder lens regions seen in any viewing angle is different. The relative brightness distribution of the five regions seen at one of the angles is shown in FIG. 2, and the visual sensory effect to people is as shown in FIG. 3. For every five regions, there is one region with the lowest brightness, which is called the dark zone. Fine stripes are formed by connecting the dark zones, and because the fine stripes have a large spacing (about 727.2 μm), and are easily recognized by the human eyes, resulting in a problem of microscopic moiré of the display device.

Figure 4:
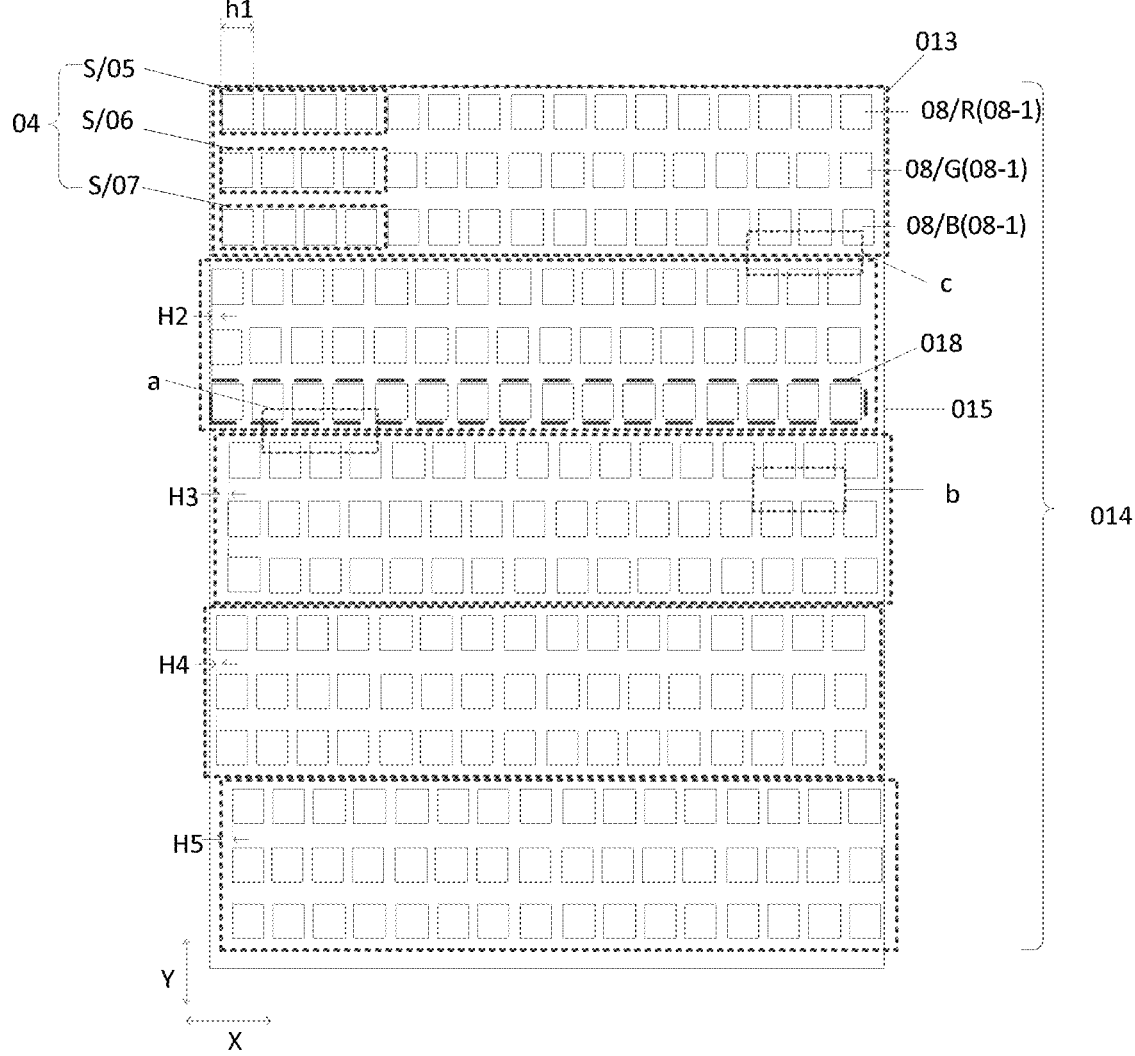
FIG. 4 is a schematic structural diagram of an array substrate provided by embodiments of the present disclosure.
Figure 5:
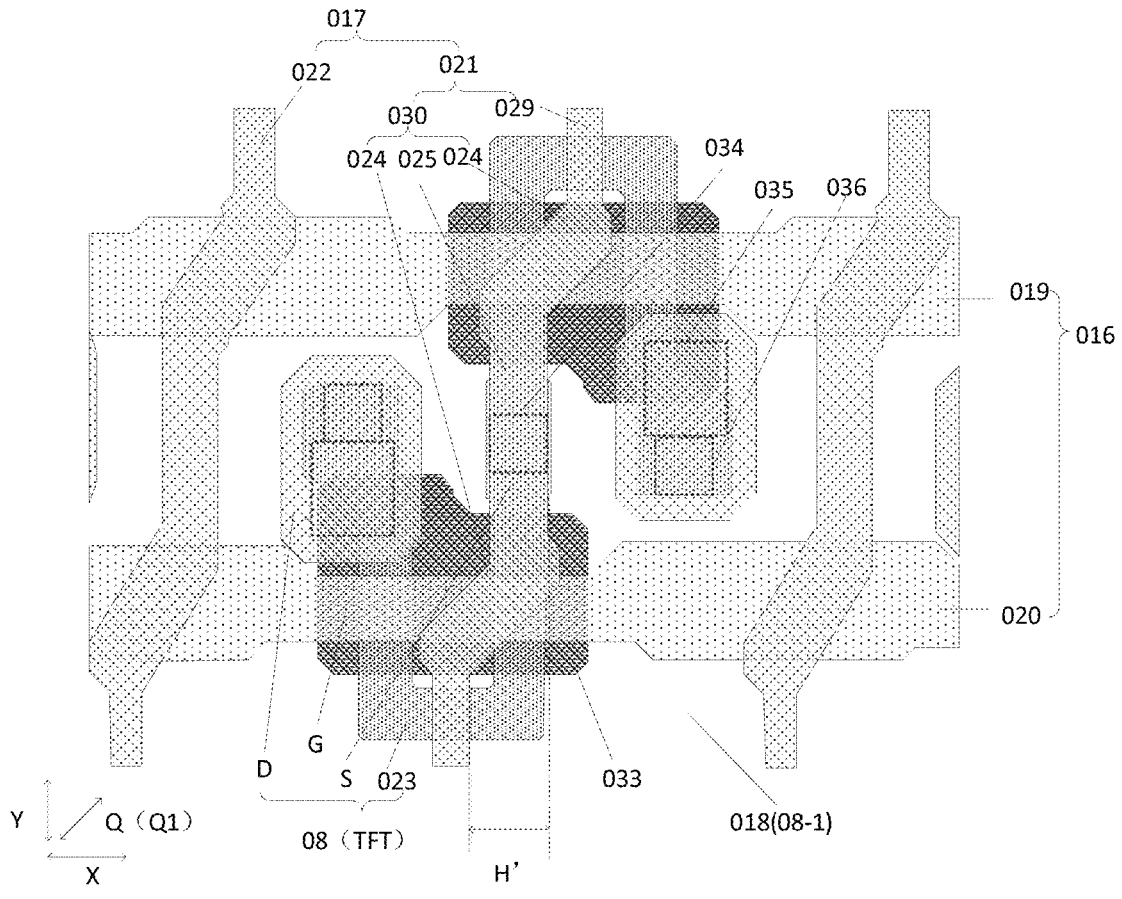
FIG. 5 is a schematic structural diagram of the region c in FIG. 4 provided by embodiments of the present disclosure.
Figure 6:
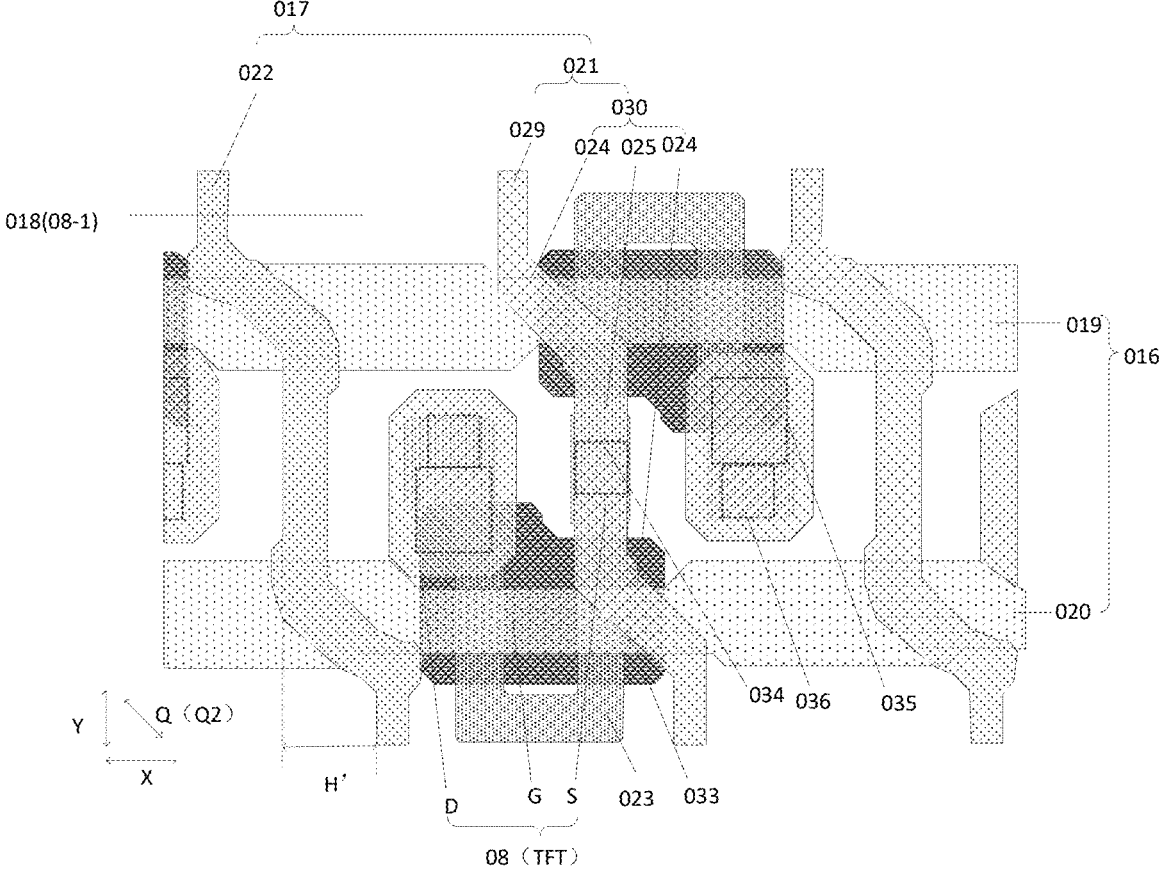
FIG. 6 is a schematic structural diagram of the region a in FIG. 4 provided by embodiments of the present disclosure.

Embodiments of the present disclosure provide an array substrate, as shown in FIGS. 4, 5, and 6, the array substrate includes: a base substrate 015, and a plurality of sub-pixel units 08, a plurality of first signal lines 016, and a plurality of second signal lines 017 on one side of the base substrate 015.

The plurality of first signal lines 016 and the plurality of second signal lines 017 intersect with each other to define opening regions 08-1 of the sub-pixel units 08.

The plurality of sub-pixel units 08 are arranged in an array along the row direction X and the column direction Y, the plurality of sub-pixel units 08 spaced apart along the row direction X form a pixel island S, and a plurality of pixel islands S arranged consecutively along the column direction Y form a pixel repeating unit 04; and one row of pixel repeating units 04 arranged along the row direction X form a pixel repeating unit row 013, and opening regions 08-1 of one row of sub-pixel units 08 arranged along the row direction X form an opening region row 018.

The plurality of first signal lines 016 are arranged along the column direction Y, and the plurality of second signal lines 017 are arranged along the row direction X.

Each second signal line 017 includes: a plurality of first portions 029 extending along the column direction Y, and a plurality of second portions 030; the second portion 030 includes parts extending along an inclined direction Q, and the second portion 030 connects two first portions 029; and an included angle between the inclined direction Q and the column direction Y and an included angle between the inclined direction Q and the row direction X are greater than 0.

The first portion 029 is adjacent to an opening region of a sub-pixel in the row direction X, the plurality of second portions 030 each pass through a region between two adjacent pixel repeating unit rows 013 of at least partial pixel repeating unit rows 013, and a distance H between the two first portions 029 connected with the second portions 030 is greater than 0 in the row direction X.

In the array substrate provided in embodiments of the present disclosure, the plurality of second portions each pass through a region between two adjacent pixel repeating unit rows of at least partial pixel repeating unit rows, and the two first portions connected with the second portion have a distance greater than 0 in the row direction, so that the opening regions of the sub-pixels in the two adjacent pixel repeating unit rows of at least partial pixel repeating unit rows are misaligned in the row direction. When the array substrate is applied to a display device with a light splitting repeating unit, the distribution of the dark zones corresponding to the light splitting repeating unit can be disrupted, so that the dark zones are misaligned, avoiding the formation of fine stripes in the column direction by successive dark zones, and mitigating the problem of microscopic moiré.

It should be noted that in FIG. 4, only the opening regions 081 of the sub-pixel units are shown, and the first signal line and the second signal line are not shown. FIG. 5 is a schematic structural diagram of the region c in FIG. 4. In FIG. 5, the second portion 030 includes portions extending along the first inclined direction Q1. FIG. 6 is a schematic structural diagram of the region a in FIG. 4, and the second portion 030 includes portions extending along the second inclined direction Q2.

In some embodiments, as shown in FIGS. 4 and 5, an orthographic projection of the second portion 030 on the base substrate 015 overlaps with an orthographic projection of the region between the two opening region rows 018 arranged in a staggered manner on the base substrate 015.

In some embodiments, as shown in FIG. 4, within one pixel repeating unit 04, sub-pixel units 08 of the same pixel island S have the same display color and sub-pixel units 08 of different pixel islands S have different display colors.

In some embodiments, as shown in FIG. 4, one pixel repeating unit 04 includes: a first pixel island 05, a second pixel island 06, and a third pixel island 07; and the first pixel island 05 includes a plurality of red sub-pixel units R, the second pixel island 06 includes a plurality of green sub-pixel units G, and the third pixel island 07 includes a plurality of blue sub-pixel units B.

In some embodiments, sub-pixel units 08 in a row of pixel islands S have the same display color, as shown in FIG. 4.

In some embodiments, as shown in FIGS. 5 and 6, the plurality of first signal lines 016 include: a plurality of first scanning lines 019 and a plurality of second scanning lines 020; and the first scanning lines 019 and the second scanning lines 020 are sequentially alternated; i.e., the present disclosure adopts a dual gate electrode design.

The same row of sub-pixel units 08 are electrically connected with one first scanning line 019 and one second scanning line 020; and in the column direction Y, the first scanning line 019 and the second scanning line 020 correspondingly electrically connected with the same row of sub-pixel units 08 are on the two sides of the opening region row 018. That is to say, there are one first scanning line 019 and one second scanning line 020 between the two adjacent opening region rows 018, and the first scanning line 019 and the second scanning line 020 are electrically connected with the sub-pixel units 08 corresponding to different opening region rows 018, respectively.

The plurality of second signal lines 017 include: a plurality of data lines 021 and a plurality of common electrode lines 022; and the data lines 021 and the common electrode lines 022 are sequentially alternated.

Each data line 021 is electrically connected with two columns of sub-pixel units 08 adjacent to the data line 021 in the row direction X.

The sub-pixel unit 08 includes a thin film transistor TFT; and a gate electrode G of the thin film transistor TFT is electrically connected with the first signal line 016, and a source electrode S of the thin film transistor TFT is electrically connected with the data line 021.

In two adjacent rows of sub-pixel units, two thin film transistors electrically connected with the same data line share the source electrode.

In the array substrate provided in embodiments of the present disclosure, on the basis of adopting a dual gate electrode design, in two adjacent rows of sub-pixel units, two thin film transistors electrically connected with the same data line share the source electrode, thereby facilitating the reduction of the area of a region outside the opening regions of the sub-pixel units, i.e., the area of the non-opening region, and facilitating the enhancement of the opening rate of sub-pixels.

In some embodiments, as shown in FIGS. 5 and 6, the second portion 030 in the data line 021 is shared as the source electrode S of the thin film transistor TFT.

It should be noted that of in the plurality of second signal lines, the data lines are electrically connected with the thin film transistors, and the common electrode lines are not electrically connected with the thin film transistors.

In some embodiments, as shown in FIGS. 5 and 6, the active layers 023 of the two thin film transistor TFTs electrically connected with the second portion 030 in the data line 021 are integrally connected, and the second portion 030 in the data line 021 is electrically connected with the integrally connected active layers 023 only through a first via hole 034.

In the array substrate provided in embodiments of the present disclosure, on the basis that two thin film transistors electrically connected with the same data line in two adjacent rows of sub-pixel units share a source electrode, the active layers of the two transistors are integrally connected, such that the shared source electrode only needs to be electrically connected with the integrally connected active layers through a first via hole, and the area of the non-opening region can be reduced, facilitating an increase in the opening rate. Moreover, it is also possible to ensure that the capacitance of the two scanning lines is consistent due to the parasitic capacitance caused by the active layer and the source electrode, avoiding poor display caused by inconsistent signal delay, i.e., RC delay, due to the charging and discharging process of the resistor (R) controlling the capacitor (C).

In some embodiments, an orthographic projection of the second portion on the base substrate has a shape of a folded line.

In some embodiments, as shown in FIGS. 5 and 6, the second portion 030 includes: two first subparts 024 extending along an inclined direction Q and parallel to each other, and a second subpart 025 connecting the two first subparts 024; and the second subpart 025 extends along a column direction Y, and the two first subparts 024 are connected with different first portions 029, respectively.

In some embodiments, as shown in FIGS. 5 and 6, an orthographic projection of the drain electrode D of the thin film transistor TFT on the base substrate is located in a region surrounded by the first scanning line 019, the second scanning line 020, and the two second subparts 025 that are adjacent to each other in the row direction X.

In the array substrate provided in embodiments of the present disclosure, the second portion has a shape of a folded line, and the two first portions electrically connected with the second portion are arranged in a staggered manner through the two first subparts extending along the inclined direction and the second subpart extending along the column direction, thereby realizing the staggered arrangement of the sub-pixel units. Moreover, in the second portion, the parts extending in the inclined direction are alternately connected with the part extending in the column direction, and a rectangular or nearly rectangular region still exists in the region between two adjacent second portions in the row direction, so as to avoid increasing the wiring difficulty of the thin film transistors.

It should be noted that in FIG. 5, the first subparts 024 extend along the first inclined direction Q1; and in FIG. 6, the first subparts 024 extend along the second inclined direction Q2.

In some embodiments, the included angle between the first inclined direction and the row direction X, and the included angle between the second inclined direction and the row direction X may be selected according to actual needs.

In some embodiments, as shown in FIGS. 5 and 6, an orthographic projection of one of the two first subparts 024 on the base substrate 015 overlaps with an orthographic projection of the first scanning line 019 on the base substrate 015, and the other of the two first subparts 024 on the base substrate 015 overlaps with an orthographic projection of the second scanning line 020 on the base substrate 015; and an orthographic projection of the second subpart 025 on the base substrate 015 and an orthographic projection of the first signal line 016 on the base substrate 015 do not overlap each other.

Figure 7:
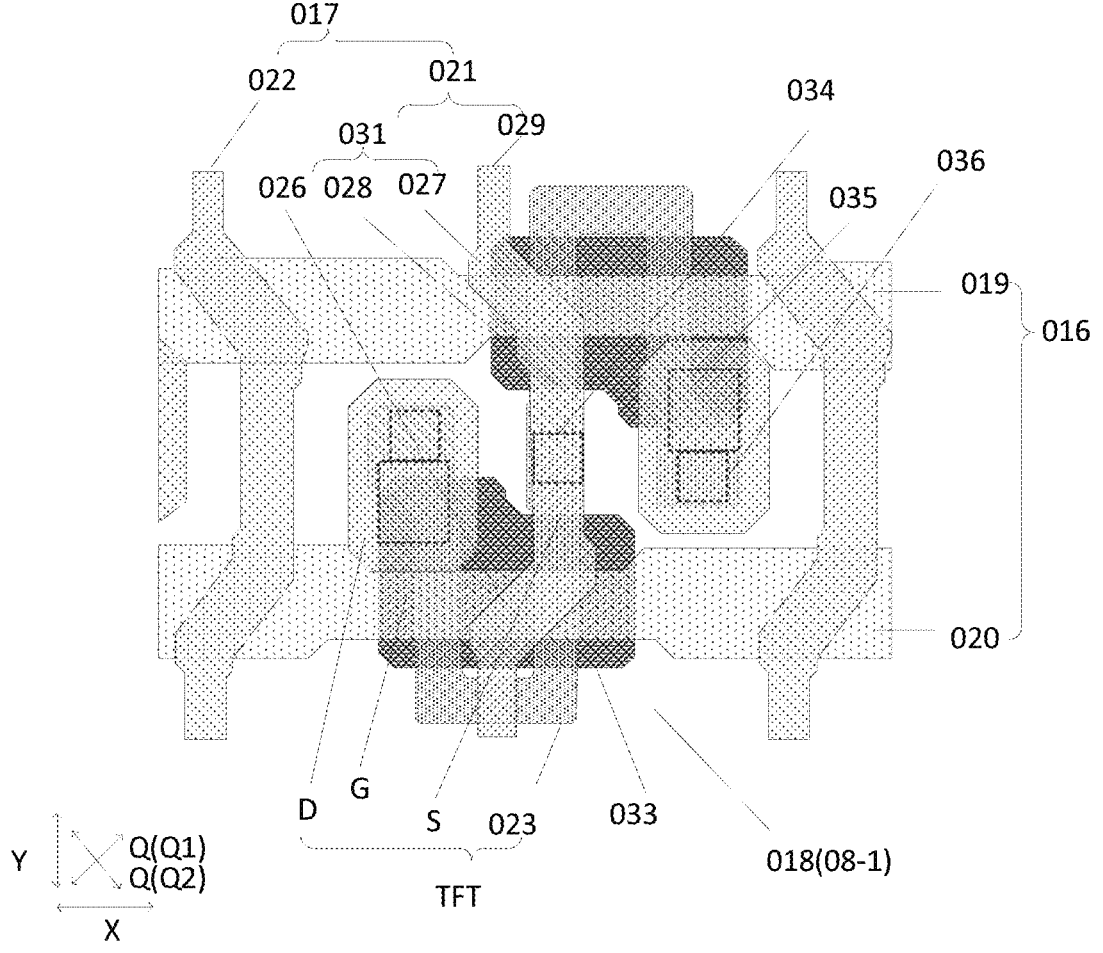
FIG. 7 is a schematic structural diagram of the region b in FIG. 4 provided by embodiments of the present disclosure.

In some embodiments, as shown in FIG. 7, each second signal line 017 further includes: a plurality of third portions 031; the remaining first portions 029 other than the first portions 029 connected through second portions 030 are connected through the third portions 031.

The two first portions 029 connected through the third portions 031 are on the same straight line in the column direction Y.

The third portion 031 includes: a third subpart 026, a fourth subpart 027, and a fifth subpart 028 extending along the column direction Y.

The two ends of the fifth subpart 028 are electrically connected with the third subpart 026 and the fourth subpart 027, respectively; and the third subpart 026 and the fourth subpart 027 are electrically connected with two different first portions 029, respectively.

The inclined direction Q includes a first inclined direction Q1 and a second inclined direction Q2. One of the third subpart 026 and the fourth subpart 027 extends along the first inclined direction Q1, and the other of the third subpart 026 and the fourth subpart 027 extends along the second inclined direction Q2. The first inclined direction Q1 intersects with the second inclined direction Q2.

The two first portions 029 connected through the third portion 031 are on the same straight line in the column direction Y.

It is to be noted that the remaining first portions other than the first portions connected through the second portions are connected through the third portions, i.e., the first portions are connected through the third portions in the region where adjacent opening region rows are not staggered.

In the array substrate provided in embodiments of the present disclosure, the third portion consists of a third subpart and a fourth subpart extending along different inclined directions, and a fifth subpart extending along the column direction, i.e., a shape of the orthographic projection of the third portion on the base substrate is a folded line and is a folded line having a raised shape. Therefore, the two first portions connected through the third portion are on the same straight line in the column direction, i.e., the two first portions connected through the third portion are not misaligned. This ensures that in adjacent sub-pixel units, the transistors corresponding to the third portions and the transistors corresponding to the second portions have the consistent RC delay, to avoid poor display caused by inconsistent RC delay.

It should be noted that FIG. 7 is an enlarged schematic view of the region b in FIG. 4.

In some embodiments, as shown in FIG. 7, an orthographic projection of the third subpart 026 on the base substrate 015 overlaps with an orthographic projection of the second scanning line 020 on the base substrate 015, and an orthographic projection of the fourth subpart 027 on the base substrate 015 overlaps with an orthographic projection of the first scanning line 019 on the base substrate 015; and an orthographic projection of the fifth subpart 028 on the base substrate 015 and an orthographic projection of the first signal line 016 on the base substrate 015 do not overlap each other.

In some embodiments, as shown in FIG. 7, active layers 023 of two thin film transistor TFTs electrically connected with the third portion 031 are integrally connected, and the third portion 031 is electrically connected with the integrally connected active layers 023 only through a first via hole 034.

That is, the third portion is shared as the source electrode of the thin film transistor, and the two thin film transistors corresponding to the third portion share the source electrode. This can reduce the area of the non-opening region, which is favorable to increasing the opening rate.

Figure 8:
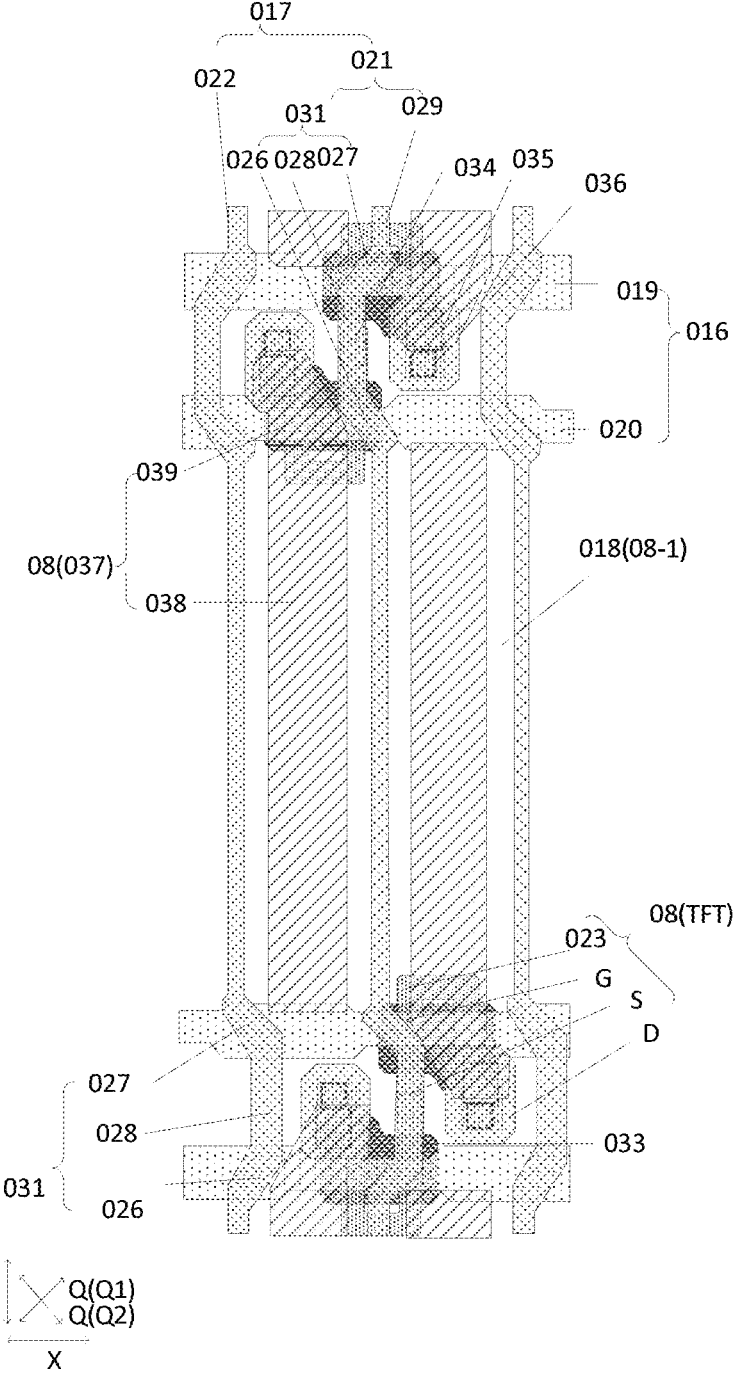
FIG. 8 is another schematic structural diagram of an array substrate provided by embodiments of the present disclosure.

It should be noted that FIG. 7 is illustrated by an example that the third subpart 026 extends along the first inclined direction Q1 and the fourth subpart 027 extends along the second inclined direction Q2. In some embodiments, it is also possible that the fourth subpart 027 extends along the first inclined direction Q1 and the third subpart 026 extends along the second inclined direction Q2 as shown in FIG. 8. Moreover, as shown in FIG. 8, it may be that in some third portions 031, the third subpart 026 extends along the first inclined direction Q1 and the fourth subpart 027 extends along the second inclined direction Q2, and in the remaining third portions 031, the fourth subpart 027 extends along the first inclined direction Q1 and the third subpart 026 extends along the second inclined direction Q2.

Figure 9:
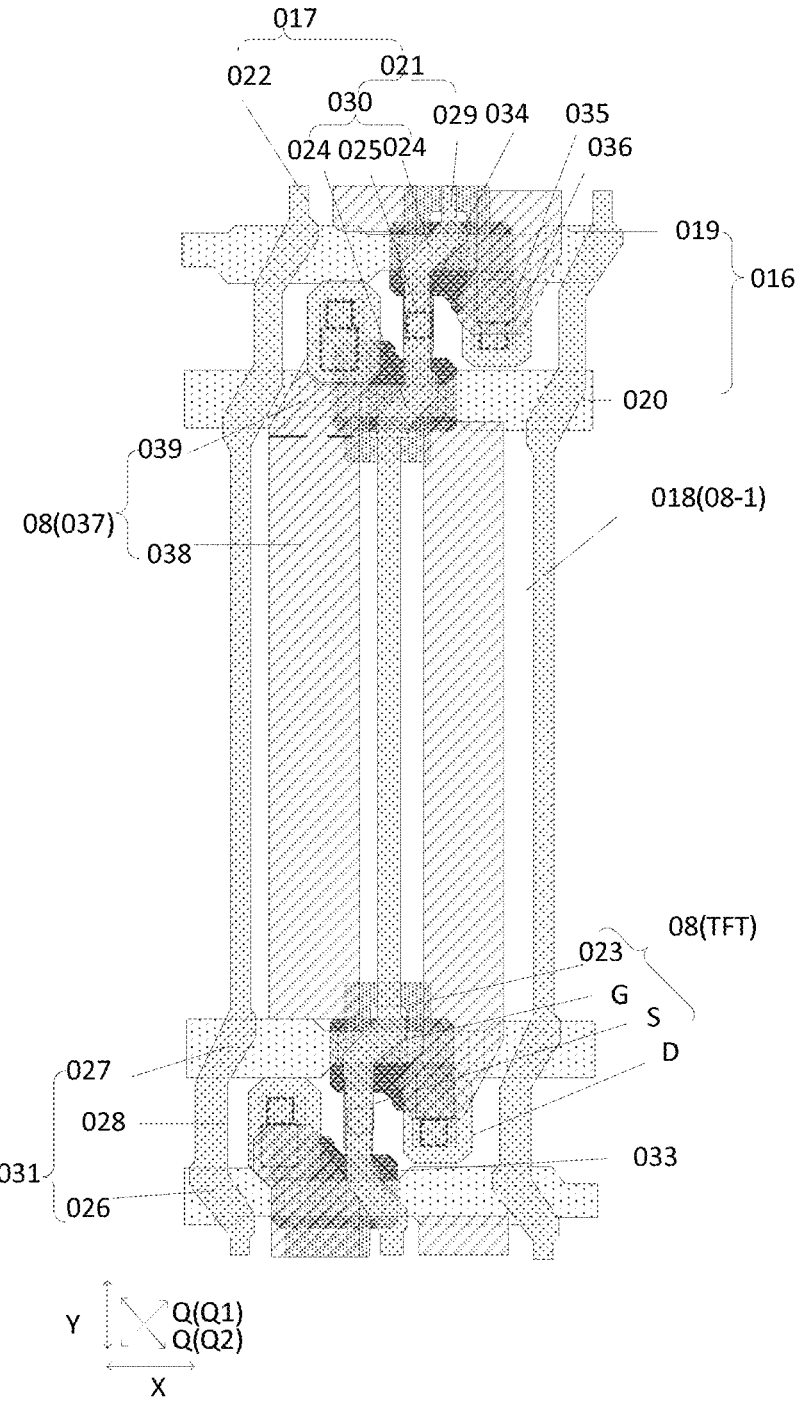
FIG. 9 is another schematic structural diagram of an array substrate provided by embodiments of the present disclosure.

In some embodiments, as shown in FIGS. 8 and 9, the sub-pixel unit 08 further includes a pixel electrode 037 electrically connected with the thin film transistor TFT; and the pixel electrode 037 is electrically connected with the drain electrode D of the thin film transistor TFT through the second via hole 035.

An orthographic projection of the pixel electrode 037 on the base substrate is non-rectangular; and an edge of the pixel electrode adjacent to the second signal line 017 has a shape of a folded line.

The pixel electrode 037 is divided into a sixth portion 038 adjacent to the first portion 029, and a seventh portion 039 connected with the sixth portion 038 and adjacent to the second portion 030 or the third portion 031; and the edge of the seventh portion 039 adjacent to the second signal line 017 extends along the column direction Y, and the included angle between at least part of the edge of the sixth portion adjacent to the second signal line 017 and the column direction Y is greater than 0.

In the array substrate provided in embodiments of the present disclosure, the second signal line includes a second portion and a third portion having a shape of a folded line, each pixel electrode includes a sixth portion covering an opening region and adjacent to the first portion and a seventh portion in a non-opening region, and the seventh portion may be regarded as a portion bent with respect to the sixth portion, so that the pattern of part of the pixel electrode electrically connected with the thin film transistor matches the region between two adjacent second portions in the row direction or the region between two adjacent third portions in the row direction, which can ensure that the storage capacitances of the sub-pixel units at different locations are consistent.

Figure 10:
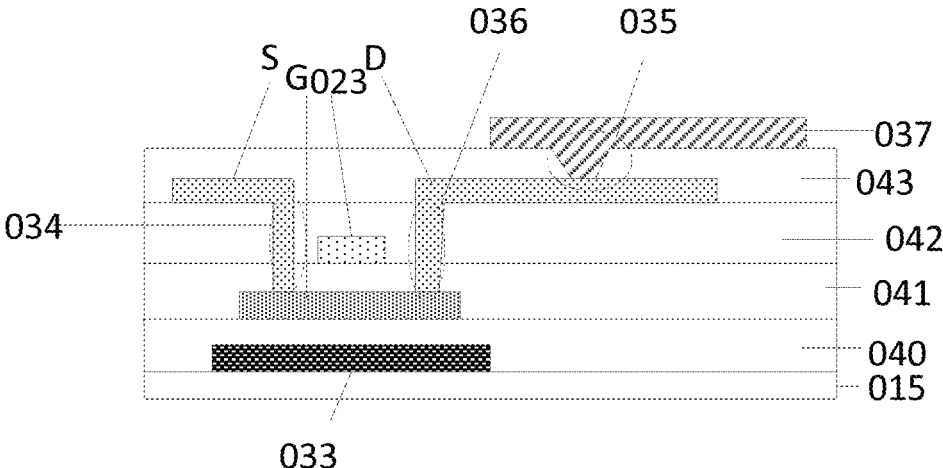
FIG. 10 is another schematic structural diagram of an array substrate provided by embodiments of the present disclosure.

In some embodiments, the thin film transistor may be a bottom gate structure or a top gate structure. In the following, taking the top gate structure as an example for illustration, as shown in FIG. 10, the array substrate further includes: a light-shielding layer 033 between the active layer 023 and the base substrate, a buffer layer 040 between active layer 023 and the light-shielding layer 033, a gate insulating layer 041 between the active layer 023 and the gate electrode G, an interlayer insulating layer 042 between the gate electrode G and the source electrode S and drain electrode D, and a first passivation layer 043 between the source electrode S and drain electrode D and the pixel electrode 037. The pixel electrode 037 is electrically connected with the drain electrode D through a second via hole 035 penetrating the first passivation layer 043, the source electrode S is electrically connected with the active layer 023 through the first via hole 034 penetrating the interlayer insulating layer 042 and the gate insulating layer 041, and the drain electrode D is electrically connected with the active layer 023 through the third via hole 042 penetrating the interlayer insulating layer 042 and the gate insulating layer 041.

In some embodiments, in the row direction X, a ratio of a width h1 of the opening region of the sub-pixel unit to a width of the pixel island S is i/M, where M is an integer greater than 1 and i is an integer greater than or equal to 1 and less than M.

As shown in FIG. 4, the plurality of pixel repeating unit rows 013 are divided into a plurality of pixel repeating unit groups 014, and each pixel repeating unit group 014 includes M pixel repeating unit rows 013. In FIG. 4, M=5 is taken as an example to illustrate.

In some embodiments, in each of the plurality of pixel repeating unit groups, a ratio of a misalignment vector of a first portion corresponding to a $j^{th}$ pixel repeating unit row with respect to a first portion corresponding to a $1^{st}$ pixel repeating unit row in the row direction to the width of the opening region of the sub-pixel unit in the row direction is Jj=±E/M; where j is an integer greater than 1 and less than or equal to M; and E is an integer greater than or equal to 1, and not equal to M and not equal to integer multiples of M.

It should be noted that the misalignment vector of the first portion corresponding to the $j^{th}$ pixel repeating unit row with respect to the first portion corresponding to the $1^{st}$ pixel repeating unit row in the row direction is equal to the misalignment vector of the $d^{th}$ sub-pixel unit in the $j^{th}$ pixel repeating unit row with respect to the $d^{th}$ sub-pixel unit in the $1^{st}$ pixel repeating unit row in the row direction X, where d is an integer greater than or equal to 1 and less than or equal to N. Thus, as shown in FIG. 4, a ratio of the misalignment vector Hj of the $d^{th}$ sub-pixel unit 08 in the $j^{th}$ pixel repeating unit row 013 with respect to the $d^{th}$ sub-pixel unit 08 in the $1^{st}$ pixel repeating unit row 013 in the row direction X to the width h1 of the sub-pixel unit 08 in the row direction X is also Jj.

That is, in the embodiments of the present disclosure, in each pixel repeating unit group, each sub-pixel in the $2^{nd}$ pixel repeating unit row to each sub-pixel in the $M^{th}$ pixel repeating unit row are all misaligned with respect to the sub-pixel in the $1^{st}$ pixel repeating unit row by Jj×h1.

It should be noted that the row direction X is taken as an example in FIG. 4, and the row direction X is the left-right extension direction in the figure. It may be that the sub-pixel unit 08 in the $j^{th}$ pixel repeating unit row 013 is misaligned to the left with respect to the sub-pixel unit 08 in the $1^{st}$ pixel repeating unit row 013; and in such a case, Hj is positive, i.e., a misalignment vector of a first portion corresponding to the $j^{th}$ pixel repeating unit row with respect to a first portion corresponding to the $1^{st}$ pixel repeating unit row corresponding to the first portion in the row direction is positive, that is, Jj=±E/M. It may also be that the sub-pixel unit 08 in the $j^{th}$ pixel repeating unit row 013 is misaligned to the right with respect to the sub-pixel 08 in the $1^{st}$ pixel repeating unit row 013; and in such a case, Hj is negative, and a misalignment vector of the first portion corresponding to the $j^{th}$ pixel repeating unit row with respect to the first portion corresponding to the $1^{st}$ pixel repeating unit row in the row direction is negative, that is, Jj=−E/M.

In some embodiments, Jj corresponding to any two pixel repeating unit rows in the $2^{nd}$ to $M^{th}$ pixel repeating unit rows are not equal, and the absolute value of the difference between Jj corresponding to any two pixel repeating unit rows is not an integer greater than or equal to 1. In this way, in one pixel repeating unit group, there is no case in which the dark zones are on the same column in the column direction, so that the distance between two dark zones arranged in the column direction can be increased, to avoid the appearance of a fine line in the column direction that is easily detectable by the human eyes.

In some embodiments, when M=5, Jj may be: −11/5, −6/5, −4/5, −3/5, −2/5, −1/5, 1/5, 2/5, 3/5, 4/5, 6/5, 11/5, and so on. When the difference between two values of Jj is M or integer multiples of M, for example, when Jj is −6/5 and −1/5, respectively, the number of luminance regions between the dark zone of this row and the dark zone of the first row when Jj is −6/5 is the same as the number of luminance regions between the dark zone of this row and the dark zone of the first row when Jj is −1/5. Therefore, E can be set as an integer greater than or equal to 1 and less than M. That is, the misalignment vector of the first portion corresponding to the $j^{th}$ pixel repeating unit row with respect to the first portion corresponding to the $1^{st}$ pixel repeating unit row in the row direction does not exceed the width of a sub-pixel in the row direction X. Therefore, an excessive misalignment distance between the sub-pixel units can be avoided while the distribution of the dark zones is disrupted, which is conducive to rationally utilizing the space of the array substrate.

It is to be noted that when M=5 and E is an integer greater than or equal to 1 and less than M, Jj may be one of the following: −4/5, −3/5, −2/5, −1/5, 1/5, 2/5, 3/5, 4/5.

In some embodiments, where M is 5, J2 is −2/5 or 3/5, J3 is 1/5 or −4/5, J4 is −1/5 or 4/5, and J5 is 2/5 or −3/5.

In some embodiments, for example, J2 is −2/5, J3 is 1/5, J4 is −1/5, and J5 is 2/5. The first portion corresponding to the $2^{nd}$ pixel repeating unit row has a misalignment vector of (−2/5) h1 in the row direction with respect to the first portion corresponding to the $1^{st}$ pixel repeating unit row. The first portion corresponding to the $3^{rd}$ pixel repeating unit row has a misalignment vector of (1/5) h1 in the row direction with respect to the first portion corresponding to the $1^{st}$ pixel repeating unit row. The first portion corresponding to the $4^{th}$ pixel repeating unit row has a misalignment vector of (−1/5) h1 in the row direction with respect to the first portion corresponding to the $1^{st}$ pixel repeating unit row. The first portion corresponding to the $5^{th}$ pixel repeating unit row has a misalignment vector of (2/5) h1 in the row direction with respect to the first portion corresponding to the $1^{st}$ pixel repeating unit row. Accordingly, as shown in FIG. 4, H2=(−2/5)h1, H3=(1/5)h1, H4=(−1/5)h1, and H5=(2/5)h1.

Of course, in some embodiments, it may also be that J2 is 3/5, J3 is −4/5, J4 is 4/5, and J5 is −3/5.

In some embodiments, as shown in FIG. 4, the opening regions 08-1 of the sub-pixels 08 in any two adjacent pixel repeating unit rows 013 are misaligned in the row direction X; that is, the difference ΔJ between Jj corresponding to any two adjacent pixel repeating unit rows 013 is not 0.

It should be noted that when E is an integer greater than or equal to 1 and less than M, if Jj corresponding to the $j^{th}$ pixel repeating unit row minus Jj−1 corresponding to the $(j−1)^{th}$ pixel repeating unit row is greater than 0, i.e., ΔJ is greater than 0, then the $(j−1)^{th}$ pixel repeating unit row is misaligned to the right with respect to the $j^{th}$ pixel repeating unit row; and if Jj corresponding to the $j^{th}$ pixel repeating unit row minus Jj−1 corresponding to the $(j−1)^{th}$ pixel repeating unit row is less than 0, i.e., ΔJ is less than 0, then the $(j−1)^{th}$ pixel repeating unit row is misaligned to the left with respect to the $j^{th}$ pixel repeating unit row. When ΔJ is greater than 0, the second portion includes a part extending along the first inclined direction Q1; and when ΔJ is less than 0, the second portion includes a part extending along the second inclined direction Q2.

It should be noted that a region between the $2^{nd}$ pixel repeating unit row 013 and the $1^{st}$ pixel repeating unit row 013 is illustrated in FIG. 5. In FIG. 5, a distance between the two first portions 029 connected through the second portion 030 is H'=H2=(−2/5)h1. A region between the $2^{nd}$ pixel repeating unit row 013 and the $3^{rd}$ pixel repeating unit row 013 is illustrated in FIG. 6. In FIG. 5, a distance between the two first portions 029 connected through the second portion 030 is H'=|H3−H2|=(3/5)h1.

In some embodiments, when the opening regions of sub-pixels in any two adjacent pixel repeating unit rows are misaligned in the row direction, an orthographic projection of the second portion on the base substrate overlaps with the orthographic projection of a region between two adjacent opening region rows which are respectively located in two different pixel repeating unit rows on the base substrate; and an orthographic projection of the third portion on the base substrate overlaps with the orthographic projection of a region between two adjacent opening region rows in the same pixel repeating unit row on the base substrate.

Figure 11:
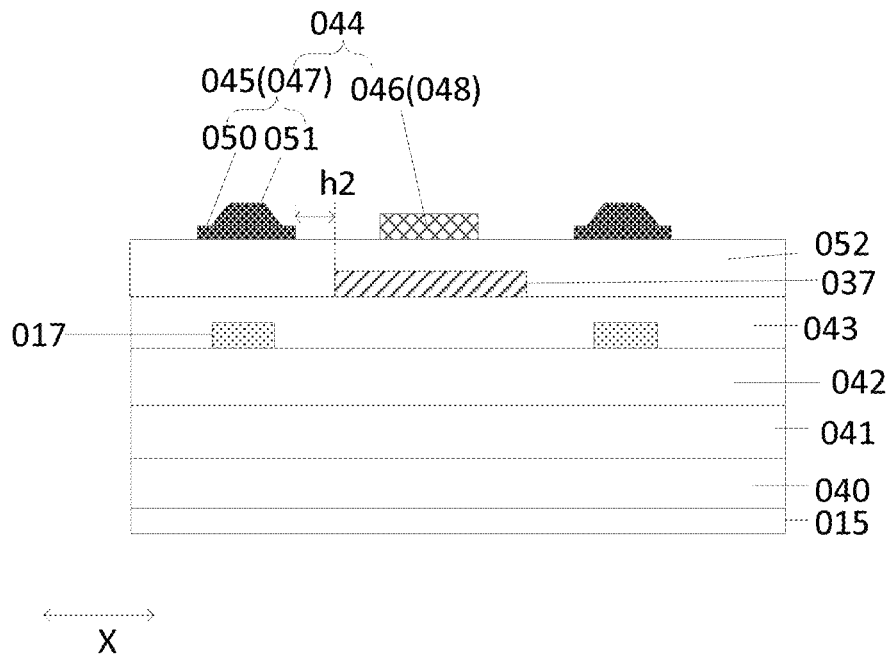
FIG. 11 is another schematic structural diagram of an array substrate provided by embodiments of the present disclosure.

In some embodiments, as shown in FIG. 11, the array substrate further includes a common electrode 044 electrically connected with the common electrode line; the common electrode 044 is on a side of the pixel electrode 037 facing away from the base substrate 015; the common electrode 044 includes: a first pattern layer 045, and a second pattern layer 046 on a side of the first pattern layer 045 facing away from the base substrate 015; and the first pattern layer 045 is electrically connected with the second pattern layer 046.

Figure 12:
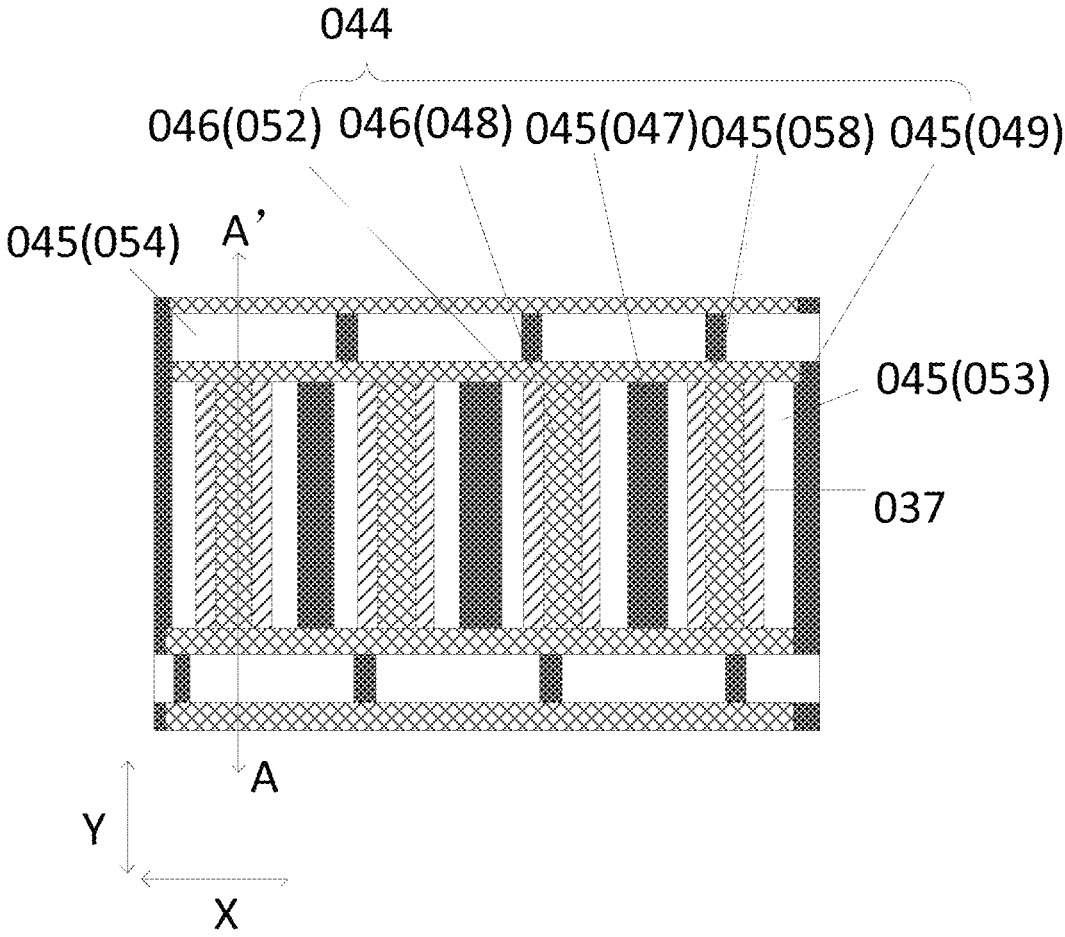
FIG. 12 is another schematic structural diagram of an array substrate provided by embodiments of the present disclosure.

As shown in FIG. 12, the first pattern layer 045 includes a plurality of first striped portions 047 arranged along the row direction X and extending along the column direction Y, and first opening regions 053 between the first striped portions 047.

As shown in FIG. 12, the second pattern layer 046 includes a plurality of second striped portions 048 arranged along the row direction X and extending along the column direction Y; and a distance between the first striped portion 047 and the second striped portion 048 is greater than 0 in the row direction X.

An orthographic projection of the first striped portion 047 on the base substrate 015 covers an orthographic projection of the second signal line 017 on the base substrate 015, the orthographic projection of the first striped portion 047 on the base substrate 015 and an orthographic projection of the pixel electrode 037 on the base substrate 015 do not overlap each other, and an orthographic projection of the second striped portion 048 on the base substrate 015 overlaps with an orthographic projection of the pixel electrode 037 on the base substrate 015.

In some embodiments, the array substrate further includes a second passivation layer 052 between the common electrode 044 and the pixel electrode 037, as shown in FIG. 11.

In some embodiments, the first pattern layer is a light-shielding conductive layer and the second pattern layer is a transparent conductive layer.

In some embodiments, the material of the first pattern layer is black or a metal material with low reflectivity; and for example, the metal material includes molybdenum. The material of the second pattern layer and the pixel electrode is, for example, indium tin oxide (ITO).

It should be noted that if the pixel electrode is located on a side of the common electrode facing away from the base substrate, i.e., positions of the common electrode and the pixel electrode are swapped in FIG. 11. In order to avoid affecting the lapping effect, the pixel electrode is required to be electrically connected with the thin film transistor through a transfer electrode provided in the same layer as the common electrode, so that the transfer electrode is electrically connected with the drain electrode through a via hole running through the layer between the transfer electrode and the drain electrode, and the pixel electrode is electrically connected with the transfer electrode through the via hole running through the second passivation layer. In order to ensure a flat effect underneath the via holes to avoid lap failure, orthographic projections of two via holes on the base substrate have different positions. Due to the limited size of the non-opening region, the via hole through which the pixel electrode is electrically connected with the transfer electrode is usually set in the display region, which affects the opening ratio of the sub-pixel units.

In the array substrate provided in embodiments of the present disclosure, the common electrode is on a side of the pixel electrode facing away from the base substrate, thereby avoiding setting the via hole through which the pixel electrode is electrically connected with the drain electrode in the display region, and avoiding affecting the opening rate of the sub-pixel units. Moreover, the light leakage between adjacent sub-pixel units can be avoided by blocking the second signal lines by the first pattern layer that shields light, and the second pattern layer having an overlap with the pixel electrodes is a light-transmitting layer, which can avoid affecting the light transmittance of the sub-pixel units.

In some embodiments, as shown in FIG. 11, a distance h2 between the pixel electrode 037 and the first striped portion 047 is greater than 0 in the row direction X.

It should be noted that in order to increase the opening rate of the sub-pixel units, the width of the first striped portion is small in the row direction, and if the pixel electrode extends to the underside of the first striped portion in the row direction, short-circuiting of the pixel electrodes of the adjacent sub-pixel units is likely to occur.

In the array substrate provided in embodiments of the present disclosure, in the row direction, orthographic projections of the pixel electrode and the first striped portion do not overlap each other, and the distance between the pixel electrode and the first striped portion is greater than 0, thereby preventing crosstalk of the electric field of the pixel electrodes to adjacent sub-pixel units.

In some embodiments, for example, h2 may be a minimum value of the distance between the pixel electrode and the first striped portion that can be realized taking into account the process conditions and the alignment error.

In some embodiments, as shown in FIG. 11, the first striped portion 047 includes a first sub-layer 050 and a second sub-layer 051 stacked in a direction perpendicular to the base substrate 015, and the second sub-layer 051 is located on a side of the first sub-layer 050 facing away from the base substrate 015. The width of the first sub-layer 050 is greater than the width of the second sub-layer 051 in a row direction X, and an orthographic projection of the second sub-layer 051 on the base substrate 015 is within an orthographic projection of the first sub-layer 050 on the base substrate 015. A distance between an edge of the orthographic projection of the second sub-layer 051 on the base substrate 015 and an edge of the orthographic projection of the first sub-layer 050 on the base substrate 015 is greater than 0. That is, the cross-section of the first striped portion has a step structure.

In the array substrate provided in embodiments of the present disclosure, since the first pattern layer is a light-shielding conductive layer, the cross-section of the first striped portion has a step structure, which is equivalent to reducing the thickness of the first striped portion close to the side of the opening region of the sub-pixel unit; and the transmittance rate of the region in the first striped portion that is not covered by the second sub-layer is greater than the transmittance rate of the region in the first striped portion that is covered by the second sub-layer, and the region in the first striped portion that is not covered by the second sub-layer is close to the opening region of the sub-pixel unit, thereby favorably increasing the opening rate of the sub-pixel units.

It is to be noted that when the array substrate is applied to a liquid crystal display panel, it is necessary to provide an opposite substrate opposite to the array substrate, and a liquid crystal layer between the array substrate and the opposite substrate; and the opposite substrate needs to be provided with a spacer to support the liquid crystal cell. The array substrate needs to be provided with an alignment layer to align liquid crystals in the liquid crystal layer. However, if the spacer slides, the alignment layer is easily scratched, and if the alignment layer in the opening region of the sub-pixel unit is scratched, it will cause poor light leakage.

In the array substrate provided in embodiments of the present disclosure, the cross-section of the first striped portion has a step structure, so that if the liquid crystal display panel is pressurized to cause the spacer to slide over a large distance, the spacer slides to the step formed by the second sub-layer and the first sub-layer, and the spacer can be blocked, preventing the spacer from sliding to the opening region of the sub-pixel unit to scratch the alignment layer in this region.

In some embodiments, a thickness of the second sub-layer 051 is greater than or equal to 0.1 micrometers and less than or equal to 2 micrometers in a direction perpendicular to the base substrate 015.

In some embodiments, as shown in FIG. 12, the first pattern layer 045 further includes a third striped portion 049 extending along the row direction X and connected with the plurality of first striped portions 047, and the second pattern layer 046 further includes a fourth striped portion 052 extending along the row direction X and connected with the plurality of second striped portions 048.

Figure 13:
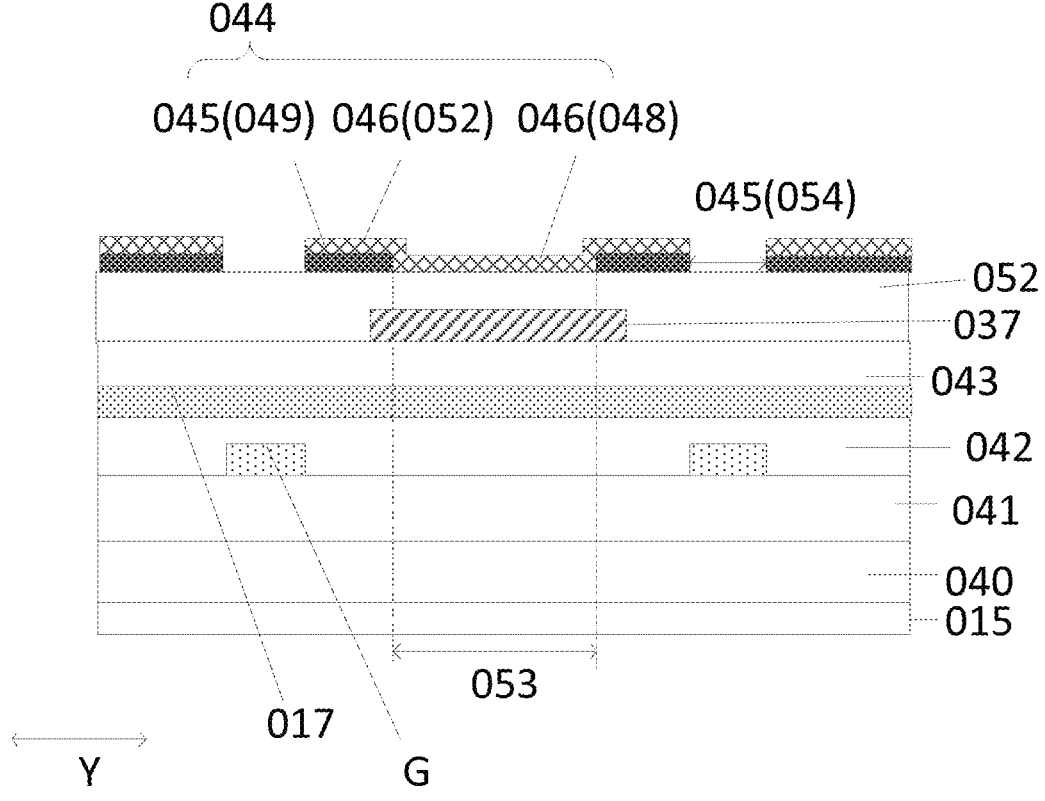
FIG. 13 is a cross-sectional view along AA' in FIG. 12 provided by embodiments of the present disclosure.

As shown in FIG. 13, an orthographic projection of the fourth striped portion 052 on the base substrate 015 overlaps with an orthographic projection of the third striped portion 049 on the base substrate 015, and the second pattern layer 046 covers the edge of the third striped portion 049 close to a side of the first opening region.

It is noted that FIG. 13 is a cross-sectional view along AA' in FIG. 12. In FIG. 12, the region enclosed by the third striped portion 049 and the first striped portion 047 is the first opening region 053, and the first opening region 053 corresponds to the opening region of the sub-pixel unit (not shown).

In some embodiments, in the column direction Y, as shown in FIG. 13, orthographic projections of two third striped portions 049 on both sides of the first opening region 053 on the base substrate 015 overlap with an orthographic projection of the pixel electrode 037 on the base substrate 015.

In the array substrate provided in embodiments of the present disclosure, the pixel electrode extends to the underside of the third striped portion, and the second pattern layer covers the edge of the third striped portion close to the side of the first opening region, i.e., the second pattern layer overlaps with the third striped portion, so as to avoid the occurrence of an arc-shaped edge of the third striped portion at the edge of the first opening region due to the etching and the resolution for the exposure process. When the array substrate is applied to a liquid crystal display panel, the formation of a vertical electric field can be avoided, thereby avoiding the occurrence of liquid crystal light leakage.

In some embodiments, the orthographic projection of the common electrode on the base substrate and the orthographic projection of the gate electrode of the thin film transistor on the base substrate do not overlap each other. Specifically, as shown in FIG. 13, the common electrode 044 has a second opening region 054 in the region corresponding to the gate electrode G of the thin film transistor. In the array substrate provided in embodiments of the present disclosure, the common electrode is hollowed out above the gate electrode of the thin film transistor, which can reduce the gate electrode of the thin film transistor and the RC delay of the gate electrode, and avoid that an increase in the amount of the delay when the gate electrode is turned on affects the charging of pixels.

In some embodiments, as shown in FIG. 12, the first pattern layer 045 further includes a fifth striped portion 058 between the second opening regions 054.

It should be noted that the second opening region is located in a non-opening region other than the opening regions of the sub-pixel units, i.e., in a region corresponding to the second portion or the third portion. Since a shape of the second portion or the third portion is a folded line, and the gate electrode is located between two second portions or between two third portions adjacent to each other in the row direction, in order to match the location of the gate electrode, as shown in FIG. 12, in the row direction X, a distance between the fifth striped portion 058 and the first striped portion 047 which are nearest is greater than 0.

Figure 14:
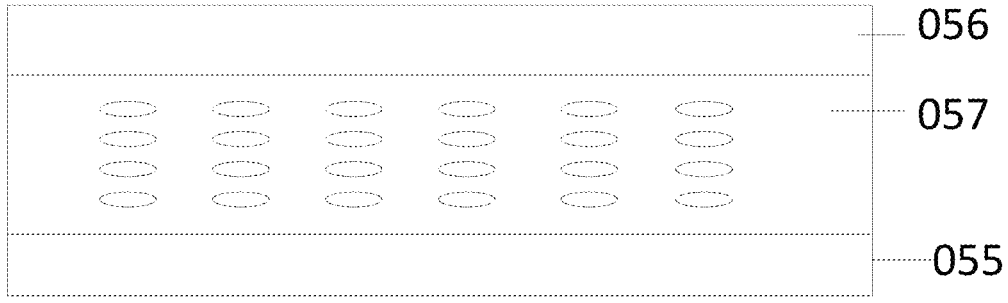
FIG. 14 is a schematic structural diagram of a display panel provided by embodiments of the present disclosure.

Based on the same inventive conception, embodiments of the present disclosure also provide a display panel, as shown in FIG. 14, including: an array substrate 055 provided by embodiments of the present disclosure, an opposite substrate 056 opposite to the array substrate 055, and a liquid crystal layer 057 between the array substrate 55 and the opposite substrate 056.

Figure 15:
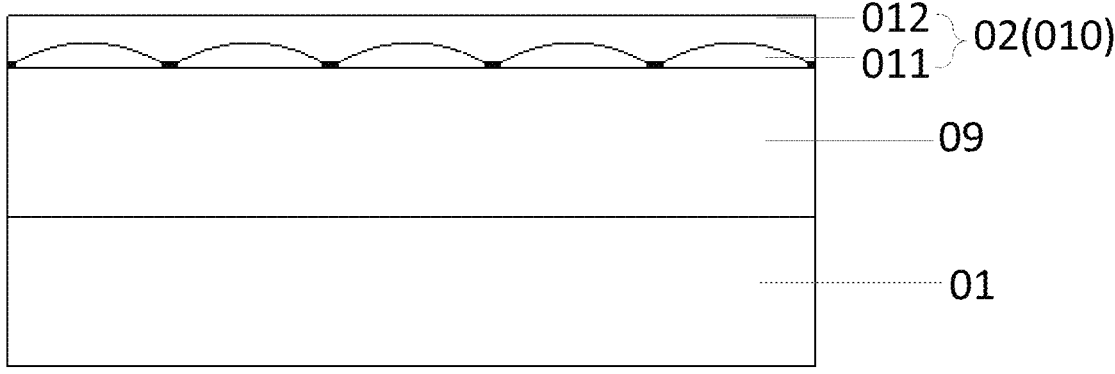
FIG. 15 is a schematic structural diagram of a display device provided by embodiments of the present disclosure.

Based on the same inventive concept, embodiments of the present disclosure also provide a display device including the display panel 01 provided by embodiments of the present disclosure, as shown in FIG. 15.

Figure 16:
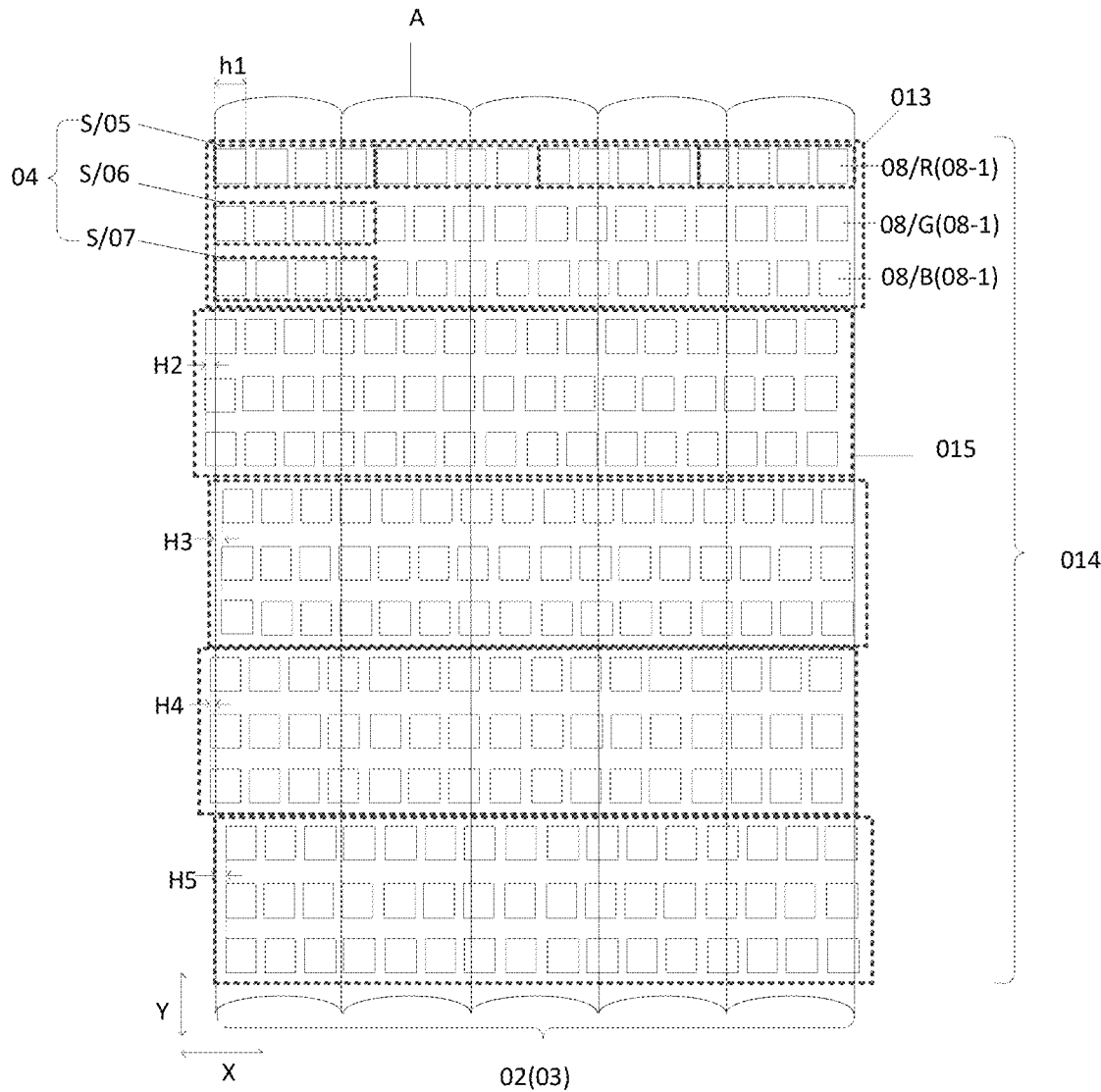
FIG. 16 is another schematic structural diagram of a display device provided by embodiments of the present disclosure.

In some embodiments, as shown in FIG. 15, the display device further includes: a light splitting assembly 02 on a display side of the display panel 01. As shown in FIG. 16, the light splitting assembly includes a plurality of light splitting repeating units 03 extending along the column direction Y and arranged continuously along the row direction X; the light splitting repeating unit 03 includes M light splitting structures A extending along the column direction Y and arranged continuously along the row direction X; and each of the light splitting repeating units 03 corresponds to N columns sub-pixel units in the pixel repeating unit row 013; where M and N are both integers greater than 1, and M and N are relatively prime.

The display device provided by embodiments of the present disclosure can be applied to the three-dimensional (3D) display, and can also realize switching between 3D display and 2D display. A pixel island can be used as a sub-pixel of the 2D display, and since a pixel island includes a plurality of sub-pixels, the same resolution as the 2D display can be maintained in a 3D display mode. A multiview display with a large viewing angle can be realized by combining a human eye-tracking system, and the 3D display with the higher pixels per inch (ppi) can also be realized, with a larger amount of information, and a lower color crosstalk between adjacent views.

In some embodiments, the light splitting structure is used to control the light emission angle of each sub-pixel to make it emit light directionally.

In some embodiments, the display panel may be one of a liquid crystal display (LCD) panel, an organic light-emitting diode (OLED) display panel, a quantum dot light-emitting diode (QLED) panel, a micro inorganic light-emitting diode (micro LED) display panel, and a mini light-emitting diode (mini LED) display panel.

In some embodiments, as shown in FIG. 15, the display device further includes: a spacer dielectric layer 09 between the light splitting assembly 02 and the display panel 01.

In some embodiments, the light splitting structure is a cylinder lens.

In some embodiments, as shown in FIG. 15, the cylinder lens 010 includes a first resin layer 011 having a protrusion, and a flat resin layer 012 on a side of the first resin layer 011 facing away from the display panel 01; and the refractive index of the flat resin layer 012 is less than the refractive index of the first resin layer 011.

Alternatively, in some embodiments, the cylinder lens is a liquid crystal lens.

Of course, in some embodiments, the light splitting structure may also be a geometric lens, a diffractive lens, a liquid lens, and other structural devices that can control the direction of light emission of the sub-pixels.

In some embodiments, the display device further includes: a human eye tracking system for determining the position of the user's eyes in real time.

The display device provided by embodiments of the present disclosure is: a cell phone, a tablet computer, a television, a monitor, a laptop computer, a digital photo frame, a navigator, and any other product or component having a display function. Other essential components of the display device should be understood by a person of ordinary skill in the art, and are not described herein, nor should they be used as a limitation of the present disclosure. The implementation of the display device can be seen in the above embodiments of the array substrate and the display panel, and will not be repeated.

In summary, in the array substrate, the display panel, and the display device provided by embodiments of the present disclosure, the plurality of second portions each pass through a region between two adjacent pixel repeating unit rows of at least partial pixel repeating unit rows, and the two first portions connected with the second portion have a distance greater than 0 in the row direction, so that the opening regions of the sub-pixels in the two adjacent pixel repeating unit rows of at least partial pixel repeating unit rows are misaligned in the row direction. When the array substrate is applied to a display device with a light splitting repeating unit, the distribution of the dark zones corresponding to the light splitting repeating unit can be disrupted, so that the dark zones are misaligned, avoiding the formation of fine stripes in the column direction by successive dark zones, and mitigating the problem of microscopic moiré.

Although preferred embodiments of the present disclosure have been described, those skilled in the art may make additional changes and modifications to these embodiments once the basic inventive concepts are known. Therefore, the appended claims are intended to be construed to include the preferred embodiments as well as all changes and modifications that fall within the scope of the present disclosure.

Obviously, those skilled in the art can make various modifications and variations to the present disclosure without departing from the spirit and scope of the present disclosure. Thus, if such modifications and variations of the present disclosure fall within the scope of the claims of the present disclosure and their equivalent technologies, the present disclosure is intended to encompass such modifications and variations.

What is claimed is:

1. An array substrate, comprising:

a base substrate; and a plurality of sub-pixel units, a plurality of first signal lines and a plurality of second signal lines on a side of the base substrate;

wherein the plurality of first signal lines and the plurality of second signal lines intersect with each other to define opening regions of the plurality of sub-pixel units;

the plurality of sub-pixel units are arranged in an array along a row direction and a column direction, the plurality of sub-pixel units spaced apart along the row direction form a pixel island, a plurality of pixel islands arranged consecutively along the column direction form a pixel repeating unit; and one row of pixel repeating units arranged along the row direction form a pixel repeating unit row, and opening regions of one row of sub-pixel units arranged along the row direction form an opening region row;

the plurality of first signal lines are arranged along the column direction, and the plurality of second signal lines are arranged along the row direction;

each of the plurality of second signal lines comprises: a plurality of first portions extending along the column direction, and a plurality of second portions; the second portion comprises parts extending along an inclined direction, and the second portion connects two of the plurality of first portions; and an included angle between the inclined direction and the column direction and an included angle between the inclined direction and the row direction are greater than 0; and the first portion is adjacent to the opening region of the sub-pixel in the row direction, the plurality of second portions respectively pass through a region between two adjacent pixel repeating unit rows of at least partial pixel repeating unit rows, and a distance between two first portions connected with the second portion in the row direction is greater than 0;

wherein the plurality of first signal lines comprise: a plurality of first scanning lines and a plurality of second scanning lines; and the first scanning lines and the second scanning lines are alternately arranged;

sub-pixel units in a same row are electrically connected with one of the plurality of first scanning lines and one of the plurality of second scanning lines, and the first scanning line and the second scanning line correspondingly electrically connected with the sub-pixel units in the same row are on two sides of the opening region row in the column direction;

the plurality of second signal lines comprise: a plurality of data lines and a plurality of common electrode lines; and the data line and the common electrode line are alternately arranged;

each of the plurality of data lines is electrically connected with two columns of sub-pixel units adjacent to the data line in the row direction;

the sub-pixel unit comprises a thin film transistor; and a gate electrode of the thin film transistor is electrically connected with the first signal line and a source electrode of the thin film transistor is electrically connected with the data line; and in two adjacent rows of sub-pixel units, two thin film transistors electrically connected with a same data line share one source electrode;

wherein active layers of two thin film transistors electrically connected with the second portion in the data line are integrally connected; and the second portion in the data line is electrically connected with the active layers integrally connected only through one first via hole.

2. The array substrate according to claim 1, wherein the second portion comprises: two first subparts extending along the inclined direction and parallel to each other, and a second subpart connecting the two first subparts;

wherein the second subpart extends along the column direction, and the two first subparts are connected with different first portions, respectively.

3. The array substrate according to claim 2, wherein an orthographic projection of one of the two first subparts on the base substrate overlaps with an orthographic projection of the first scanning line on the base substrate, and an orthographic projection of the other of the two first subparts on the base substrate overlaps with an orthographic projection of the second scanning line on the base substrate; and an orthographic projection of the second subpart on the base substrate and an orthographic projection of the first signal line on the base substrate do not overlap with each other.

4. The array substrate according to claim 1, wherein each of the plurality of second signal lines further comprises: a plurality of third portions; and first portions other than the first portions connected through the second portions are connected through the plurality of third portions;

two first portions connected through the third portion are on a same straight line in the column direction;

the third portion comprises: a third subpart extending along a first inclined direction, a fourth subpart extending along a second inclined direction, and a fifth subpart extending along the column direction;

two ends of the fifth subpart are electrically connected with the third subpart and the fourth subpart, respectively; and the third subpart and the fourth subpart are electrically connected with two different first portions, respectively;

the first inclined direction intersects with the second inclined direction; and two first portions connected through the third portion are on a same straight line in the column direction.

5. The array substrate according to claim 4, wherein an orthographic projection of the third subpart on the base substrate overlaps with an orthographic projection of the second scanning line on the base substrate, and an orthographic projection of the fourth subpart on the base substrate overlaps with an orthographic projection of the first scanning line on the base substrate; and an orthographic projection of the fifth subpart on the base substrate and an orthographic projection of the first signal line on the base substrate do not overlap with each other.

6. The array substrate according to claim 4, wherein active layers of two thin film transistors electrically connected with the third portion are integrally connected, and the third portion is electrically connected with the active layers electrically connected integrally only through one first via hole.

7. The array substrate according to claim 4, wherein the opening regions of the sub-pixels in any two adjacent pixel repeating unit rows are misaligned in the row direction;

an orthographic projection of the second portion on the base substrate overlaps with an orthographic projection of a region between two adjacent opening region rows which are respectively located in two different pixel repeating unit rows on the base substrate; and an orthographic projection of the third portion on the base substrate overlaps with an orthographic projection of a region between two adjacent opening region rows in the same pixel repeating unit row on the base substrate.

8. The array substrate according to claim 7, wherein in the row direction, a ratio of a width of the opening region of the sub-pixel unit to a width of the pixel island is i/M, wherein M is an integer greater than 1, and i is an integer greater than or equal to 1 and less than M;

the plurality of pixel repeating unit rows are divided into a plurality of pixel repeating unit groups, and each of the plurality of pixel repeating unit groups comprises M pixel repeating unit rows; and in each of the plurality of pixel repeating unit groups, a ratio of a misalignment vector of a first portion corresponding to a $j^{th}$ pixel repeating unit row with respect to a first portion corresponding to a $1^{st}$ pixel repeating unit row in the row direction to the width of the opening region of the sub-pixel unit in the row direction is $Jj=\pm E/M$, wherein j is an integer greater than 1 and less than or equal to M, and E is an integer greater than or equal to 1 and less than M.

9. The array substrate according to claim 4, wherein the sub-pixel unit further comprises a pixel electrode electrically connected with the thin film transistor;

an orthographic projection of the pixel electrode on the base substrate is non-rectangular; and an edge of the pixel electrode adjacent to the second signal line has a shape of a folded line;

the pixel electrode is divided into a sixth portion adjacent to the first portion, and a seventh portion connected with the sixth portion and adjacent to the second portion or the third portion; and an edge of the seventh portion adjacent to the second signal line extends along the column direction, and an included angle between at least part of an edge of the sixth portion adjacent to the second signal line and the column direction is greater than 0.

10. The array substrate according to claim 9, further comprising a common electrode electrically connected with the common electrode line;

wherein the common electrode is on a side of the pixel electrode facing away from the base substrate;

the common electrode comprises: a first pattern layer, and a second pattern layer on a side of the first pattern layer facing away from the base substrate; wherein the first pattern layer is electrically connected with the second pattern layer;

the first pattern layer comprises a plurality of first striped portions arranged along the row direction and extending along the column direction, and first opening regions between the plurality of first striped portions;

the second pattern layer comprises a plurality of second striped portions arranged along the row direction and extending along the column direction; wherein a distance between the first striped portion and the second striped portion is greater than 0 in the row direction; and an orthographic projection of the first striped portion on the base substrate covers an orthographic projection of the second signal line on the base substrate, the orthographic projection of the first striped portion on the base substrate and an orthographic projection of the pixel electrode on the base substrate do not overlap with each other, and an orthographic projection of the second striped portion on the base substrate overlaps with an orthographic projection of the pixel electrode on the base substrate.

11. The array substrate according to claim 10, wherein in the row direction, a distance between the pixel electrode and the first striped portion is greater than 0.

12. The array substrate according to claim 10, wherein the first striped portion comprises: a first sub-layer and a second sub-layer stacked in a direction perpendicular to the base substrate;

the second sub-layer is on a side of the first sub-layer facing away from the base substrate;

in the row direction, a width of the first sub-layer is greater than a width of the second sub-layer; and an orthographic projection of the second sub-layer on the base substrate is within an orthographic projection of the first sub-layer on the base substrate.

13. The array substrate according to claim 10, wherein the first pattern layer further comprises a third striped portion extending along the row direction and connected with the plurality of first striped portions, and the second pattern layer further comprises a fourth striped portion extending along the row direction and connected with the plurality of second striped portions; and an orthographic projection of the fourth striped portion on the base substrate overlaps with an orthographic projection of the third striped portion on the base substrate, and the second pattern layer covers an edge of the third striped portion close to a side of the first opening region.

14. The array substrate according to claim 13, wherein in the column direction, orthographic projections of two third striped portions on both sides of the first opening region on the base substrate overlap with an orthographic projection of the pixel electrode on the base substrate.

15. The array substrate according to claim 10, wherein an orthographic projection of the common electrode on the base substrate and an orthographic projection of the gate electrode of the thin film transistor on the base substrate do not overlap with each other.

16. A display panel, comprising:

the array substrate according to claim 1;

an opposite substrate opposite to the array substrate; and a liquid crystal layer between the array substrate and the opposite substrate.

17. A display device, comprising the display panel according to claim 16.

18. The display device according to claim 17, comprising:

a light splitting assembly on a display side of the display panel;

wherein the light splitting assembly comprises a plurality of light splitting repeating units extending along the column direction and continuously arranged along the row direction;

the light splitting repeating unit comprises M light splitting structures extending along the column direction and continuously arranged along the row direction; and each of the plurality of light splitting repeating units corresponds to N columns of sub-pixel units in the pixel repeating unit row; wherein M and N are both integers greater than 1, and M and N are relatively prime.

* * * * *